United States Patent
Insalaco et al.

(10) Patent No.: US 6,669,995 B1
(45) Date of Patent: Dec. 30, 2003

(54) METHOD OF TREATING AN ANTI-REFLECTIVE COATING ON A SUBSTRATE

(76) Inventors: Linda Insalaco, 17911 Hickman St., Poolesville, MD (US) 20837; James Mitchener, 12 Kings Valley Ct., Damascus, MD (US) 20872

( * ) Notice: Subject to any disclaimer, the term of this patent is extended or adjusted under 35 U.S.C. 154(b) by 0 days.

(21) Appl. No.: 08/321,672

(22) Filed: Oct. 12, 1994

(51) Int. Cl.$^7$ ................................................. B05D 3/06
(52) U.S. Cl. .................... 427/558; 204/157.15; 437/228
(58) Field of Search ..................... 204/157.15; 427/558; 432/228

(56) References Cited

U.S. PATENT DOCUMENTS

| | | | |
|---|---|---|---|
| 3,890,176 A | 6/1975 | Bolon ........................... 156/2 |
| 4,548,688 A | 10/1985 | Matthews .............. 204/157.18 |
| 4,557,797 A | * 12/1985 | Fuller et al. ................. 156/643 |
| 4,568,632 A | * 2/1986 | Blum et al. .................. 430/322 |
| 4,718,974 A | 1/1988 | Minaee ........................ 156/643 |
| 4,770,739 A | * 9/1988 | Orvek et al. ................. 156/643 |
| 5,225,251 A | 7/1993 | Esrom ......................... 427/552 |
| 5,234,990 A | 8/1993 | Flaim et al. ................. 524/609 |
| 5,310,622 A | * 5/1994 | Sardella ....................... 430/313 |

FOREIGN PATENT DOCUMENTS

EP 0 471 527 2/1992

OTHER PUBLICATIONS

Sethi et al., Use of Anti–Reflective Coatings in Deep UV Lithography, SPIE, vol. 1463, Optical/Laser Microlithography IV (1991), pp. 30–40.*

Sturtevant, John, et al., "Antireflection Coating Process Characterization and Improvement for DUV Lithography at 0.25 µm Groundrules," *Proceedings SPIE—The International Society for Optical Engineering*, Timothy A. Brunner, ed., vol. 2440, Feb. 22–24, 1995, pp. 582–593.

Thuy Ta et al., A Sub–Half Micron Deep UV Integrated ARC Process, no date given.

Barnes et al., Anti–Reflective Coating for Deep UV Lithography Process Enhancement.

Witowski et al., Relationship Between DUV Lithography And Etch for Pattern Transfer, SPIE, vol. 1593 Dry Etch Technology (1991), pp. 105–117.

Fusion 150.200P—UV/Bake™ Process The Low Pressure Question?, Fusion Semiconductor—UV/Bake, Atmospheric vs. Low Pressure (rev. Jun. 10, 1991), pp. 1–4.

Vinet et al., Comparative Study of Deep UV Resist Processes For 0.35 µm Technology, SPIE, vol. 1672, Advances in Resist Technology and Processing IX (1992), pp. 526–539.

Lin et al., Some Aspects of Anti–Reflective Coatings For Optical Lithography, SPIE, vol. 469, Advances in Resist Technology (1984), pp. 30–37.

Sethi et al., Use of Anti–Reflective Coatings In Deep UV Lithography, SPIE, vol. 1463, Optical/Laser Microlithography IV (1991), pp. 30–40.

Ting et al., An Improved Deep Ultra Violet (DUV) Multilayer Resist Process For High Resolution Lithography, SPIE, vol. 469, Advances in Resist Technology (1984), pp. 24–29.

Dudley et al., Enhancement Of Deep UV Patterning Integrity And Process Control Using Anti–Reflective Coating, SPIE, vol. 1672, Advances in Resist Technology and Processing IX (1992), pp. 638–646.

Matthews et al., Stabilization Of Single Layer and Multilayer Resist Patterns To Aluminum Etching Environments, SPIE Conference, Optical Microlithography III, Santa Clara, CA, Mar. 14–15, 1984.

Matthews et al., Microlithrography Techniques Using a Microwave Powered Deep UV Source, presented at SPIE Conference on Microlithography, Mar. 13–14, 1983.

Sematch & Semi/Sematech 1994 President's Day Meeting, Lithography Working Group Session On 0.25 µm Technology Requirements Apr. 1994.

* cited by examiner

Primary Examiner—Dwayne C. Jones
Assistant Examiner—C. Delacroix-Muirhead
(74) Attorney, Agent, or Firm—Edell, Shapiro & Finna LLC; Martin Abramson

(57) ABSTRACT

A method of treating an anti-reflective coating on a substrate. The method includes exposing the anti-reflective coating to a dosage of ultraviolet radiation sufficient to result in the direct removal of at least a portion of the exposed anti-reflective coating.

33 Claims, 4 Drawing Sheets

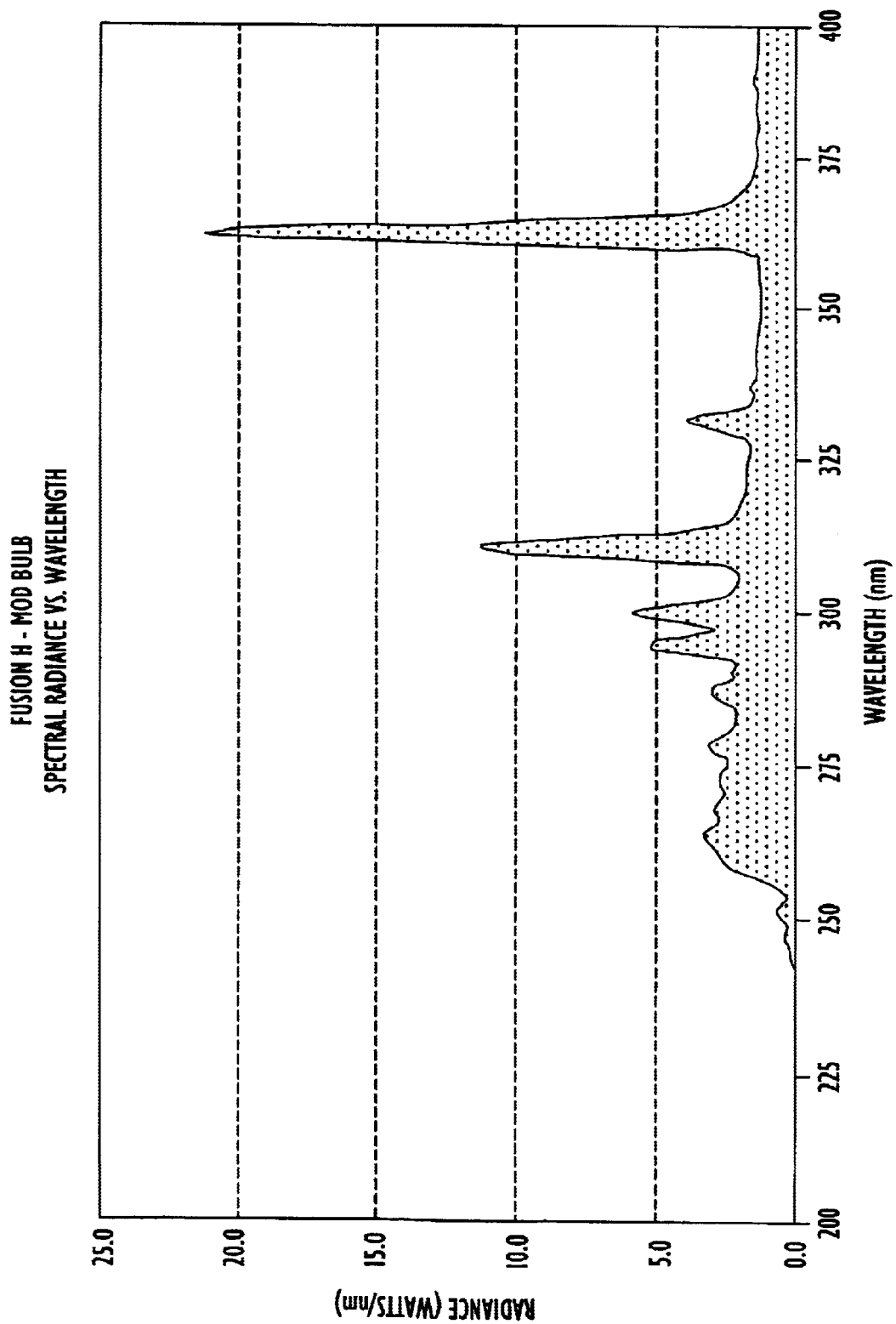

METHOD OF TREATING AN ANTI-REFLECTIVE COATING ON A SUBSTRATE

FIELD OF THE INVENTION

The invention relates to a method of treating an anti-reflective coating on a substrate and also to a method of forming an electronic device. The method of forming an electronic device includes treating an anti-reflective coating on a substrate.

BACKGROUND OF THE INVENTION

Microelectronic devices used in the construction of integrated circuits are manufactured by means of photolithographic techniques. Fabricating various structures, particularly electronic device structures, typically involves depositing at least one layer of a photosensitive material, typically known as a photoresist material, on a substrate. The photoresist material may then be patterned by exposing it to radiation of a certain wavelength to alter characteristics of the photoresist material. Typically, the radiation is from the ultraviolet range of wavelengths. The radiation preferably causes desired photochemical reactions to occur within the photoresist. Preferably, the photochemical reactions alter the solubility characteristics of the photoresist, thereby allowing removal of certain portions of the photoresist. Selectively removing certain parts of the photoresist allows for the protection of certain areas of the substrate while exposing other areas. The remaining portions of the photoresist may be used as a mask or stencil for processing the underlying substrate.

An example of such a process is in the fabrication of semiconductor devices wherein, for example, layers are formed on a semiconductor substrate. Certain portions of the layers may be removed to form openings through the layers. The openings may allow diffusion of desired impurities through the openings into the semiconductor substrate. Other processes are known for forming devices on a substrate.

Devices such as those described above, may be formed by introduction of a suitable impurity into a wafer of a semiconductor to form suitably doped regions therein. In order to provide distinct P or N regions, which are necessary for the proper operation of the device, introduction of impurities should occur through only a limited portion of the substrate. Usually, this is accomplished by masking the substrate with a diffusion resistant material, which is formed into a protective mask to prevent diffusion through selected areas of the substrate.

The mask in such a procedure is typically provided by forming a layer of material over the semiconductor substrate and, afterward creating a series of openings through the layer to allow the introduction of the impurities directly into the underlying surface within a limited area. These openings in the mask are readily created by coating the mask with a material known as a photoresist. Photoresists can be negative photoresist or positive photoresist materials.

A negative photoresist material is one which is capable of polymerizing and being rendered insoluble upon exposure to radiation. Accordingly, when employing a negative photoresist material, the photoresist is selectively exposed to radiation, causing polymerization to occur above those regions of the substrate which are intended to be protected during a subsequent operation. The unexposed portions of the photoresist are removed by a solvent which is inert to the polymerized portion of the photoresist. Such a solvent may be an aqueous solvent solution.

Positive photoresist material is a material that, upon exposure to radiation, is capable of being rendered soluble in a solvent in which the unexposed resist is not soluble. Accordingly, when applying a positive photoresist material the photoresist is selectively exposed to radiation, causing the reaction to occur above those portions of the substrate which are not intended to be protected during the subsequent processing period. The exposed portions of the photoresist are removed by a solvent which is not capable of dissolving the exposed portion of the resist. Such a solvent may be an aqueous solvent solution.

Photoresist materials may be similarly be used to define other regions of electronic devices.

In an effort to increase the capability of electronic devices, the number of circuit features included on, for example, a semiconductor chip, has greatly increased. When using a process such as that described above for forming devices on, for instance, a semiconductor substrate, increasing the capability and, therefore, the number of devices on a substrate requires reducing the size of the devices or circuit features. One way in which the size of the circuit features created on the substrate has been reduced is to employ mask structures having smaller openings. Such smaller openings treat smaller portions of the substrate, thereby creating smaller structures in the photoresist. In order to produce smaller structures in the photoresist, shorter wavelength ultraviolet radiation is also used in conjunction with the mask to image the photoresist. Such shorter wavelengths of radiation have also been particularly effective at curing or hardening photoresist materials used in fabricating the devices.

Until recently, in forming electronic devices, photoresists have been used that are sensitive at g-line (436 nm) and i-line (365 mn) for most microelectronic applications. Examples photoresists sensitive to such wavelengths are novolak-type photoresists. As the desire to form smaller features, on the order of sub-micron and sub-half-micron, on substrates has increased, photoresists have been formulated that are sensitive to UV radiation in the range of about 248 nm. Such wavelengths are referred to as deep UV since they are deep within the UV range. Photoresists which are sensitive to such wavelengths are known as deep UV photoresists. Many deep UV photoresists differ significantly from commonly used photoresists used to make devices with larger sized features. In particular, deep UV photoresists differ from novolak-type formulations and also have different optical properties.

Typically, systems for creating electronic devices as described above include a UV radiation source for exposing the photoresist.

As methods for producing miniature electronic structures improve, the desire to produce even smaller structures has continued to increase. Problems encountered in further device miniaturization include obtaining desired resolution in the UV radiation source and improved focusing resolution and depth of focus of the UV radiation on the photoresist. Other problems encountered include radiation leakage through the mask. Radiation leakage has been addressed by ensuring that the UV radiation to which the mask and the photoresist are exposed is well within the deep UV range and, in particular, less than 245 nm in wavelength. Additionally, the problem of long exposure times to increase the penetration of the UV radiation through planarization layers. Further problems include the ability of the patterns formed in the resist to withstand high powered dry processes without the loss of the image integrity.

As stated above, progress in processes for forming structures in photoresists has led to the creation of sub-micron and even sub-half-micron structures. For example, structures as small as 0.3 microns have even been created. In addition to the above-described problems, another common problem encountered as structure size has decreased is that thinner layers of photoresist must be used to ensure, among other things, that depth of focus requirements of the exposure tool are met. The exposure tool referring to the radiation source, optics, mask and other components used to expose the photoresist. The photoresists used, especially at such lesser thicknesses are highly transmissive of ultraviolet wavelengths used. The transmissivity of the photoresist combined with the high reflectivity to the UV wavelengths of commonly used substrates results in the reflection of the UV radiation back into the photoresist resulting in further photochemical reactions taking place in the photoresist. The further photochemical reactions resulting from the UV radiation reflected off of the substrate typically result in uneven exposure of the photoresist.

As the light is reflected off of the substrate, standing waves may be created. As a result, the structure which was intended to be created by the mask will not be created, as particularly evidenced by inconsistent feature dimensions. This results in device error and possibly failure. For minimum feature sizes of greater than about 1.0 microns, the standing waves and dimensional instability can be minimized by a post-exposure bake process that may allow the photoresist to diffuse more evenly. However, the reduction in standing wave effects and dimensional stability produced by a post-exposure bake is insufficient for sub-half micron feature sizes.

In order to address the transmissivity and reflectivity problems, anti-reflective coatings have been developed which are applied to substrates prior to applying a photoresist. As the photoresist is exposed to UV radiation, the anti-reflective coating or ARC absorbs a substantial amount of the UV radiation. The ARC thereby prevents the radiation from reflecting off of the substrate and reacting with the parts of the photoresist which should not be reacted by the mask. Anti-reflective coatings greatly reduce the impact of highly reflective substrate surfaces as well as the impact of grainy substrate surfaces and topographical features on the substrate surface during deep UV imaging.

In lithography using G- and I-line UV wavelengths, inorganic and organic ARC films have been used. However, some organic ARC films have been found to be more effective with the photoresists that are sensitive at deep UV wavelengths. These organic ARC materials include polysulfones and polyureas.

Typical anti-reflective coatings can reduce the reflectance of a substrate from in the neighborhood of about 40% to about 50% up to nearly about 100%. Anti-reflective coatings have also improved focal depth for some film layers. One problem which is particularly aggravated by relatively transparent photoresist materials and highly reflective substrate surfaces is the creation of standing waves. By eliminating or at least greatly reducing problems associated with reflectivity, anti-reflective coatings allow for the formation of sub-micron structures in the photoresist, very faithful reproduction of the mask pattern, and nearly vertical resist edge profiles in the photoresist. Accordingly, it can be seen that anti-reflective coatings have been quite successful in helping to achieve the production of very small structures in photoresist on a substrate.

Although they have been quite useful to alleviate problems associated with reflectivity of substrate surfaces and transparency of photoresists, the use of anti-reflective coatings has created additional problems. These problems particularly manifest themselves, for example, after the deposition of the ARC and the photoresist layers, exposure of the photoresist, and development of the photoresist. After development of the photoresist, the remaining photoresist on the substrate may be exposed to ultraviolet radiation and elevated temperatures to cure or harden it. A process for hardening of photoresist is disclosed by U.S. patent application Ser. No. 497,688, filed May 23, 1983, now U.S. Pat. No. 4,548,688 to Matthews, the entire disclosure of which is hereby incorporated by reference.

Subsequent to development of the photoresist, the anti-reflective coating exposed by the developing of the photoresist must be removed prior to further processing the substrate. At this point, the additional problems become particularly apparent. For sub-micron work, the resist pattern must be transferred into the arc layer by dry etch processing. However, many problems are associated with ARC etching. For example, the ARC etches very slowly and at about a one to one selectivity with the commonly known photoresist. Therefore, the ARC must be subjected for an extended period to whatever process is used to remove it. Due to the low selectivity ratio, the photoresist may be removed as well.

The remaining photoresist on the substrate may be exposed to ultraviolet radiation and elevated temperatures to cure or harden it at this point, instead of or in addition to the above time, prior to removal of the exposed anti-reflective coating. The curing or hardening at this point may also be carried out according to the process described above, or any other known process.

As a result, critical dimension of the photoresist pattern can be altered. Additionally, overall resist thickness can be reduced before the substrate has even begun to be etched. Further, in the time required to remove the anti-reflective coating, the photoresist may be totally etched away, resulting in unintended exposure of the substrate. Such unintended exposure may result in defects in the device being produced.

The problems in etching the ARC layer are compounded by the necessity to completely etch the exposed ARC from the substrate prior to any further processing of the substrate so as to ensure proper processing of the substrate. Residues remaining from incomplete etching of the ARC typically cause problems after ARC etch. Among these problems are incomplete or inaccurate processing of the substrate as a result of anti-reflective coating residues not allowing the substrate to be treated.

SUMMARY OF THE INVENTION

One way in which the ARC etch problem has been addressed is by creating and manufacturing new equipment especially for removing anti-reflective coatings. However, such equipment is costly and additionally time and energy must be expended in design, construction and operation.

Another possible solution to the above-described problems associated with removal of the anti-reflective coating is to increase the thickness of the photoresist layer. Increasing the photoresist thickness could reduce the potential for unintended exposure of the substrate during processing. However, increasing the photoresist thickness does not solve the above problems because to create sub-micron structures in the resist, the resist must be very thin to meet the depth of focus requirements of the exposure tools used for patterning the photoresist. Increasing the thickness of the photoresist also increases the expense of producing devices through increased use of photoresist and increased waste of photoresist which is removed during ARC etching.

If the ARC etch problems are not dealt with, little resist may be left for the subsequent etching processes after the ARC has been etched.

It is an object of the present invention to provide a process for treating anti-reflective coatings.

Another object of the present invention is to provide a method of treating an anti-reflective coating which at least partially removes the anti-reflective coating.

An additional object of the present invention is to reduce the ARC etch time.

Also, an object of the present invention is to provide a method of forming an electronic device the method including treating an anti-reflective coating so as to remove the anti-reflective coating and/or change the time required for removal and/or improve the ARC to resist selectivity.

According to preferred aspects, the present invention provides a method of treating an anti-reflective coating on a substrate. The method includes exposing the anti-reflective coating to a dosage of ultraviolet energy sufficient to induce physical or photochemical reactions resulting in the removal of at least a portion of the exposed anti-reflective coating.

According to further preferred aspects of the invention, the invention provides a method of forming an electronic device. The method includes providing a substrate. A layer of an anti-reflective coating is deposited on the substrate. Then a layer of a photoresist material is deposited on the anti-reflective coating. Next, the photoresist is selectively exposed to ultraviolet radiation so as to selectively cause the photoresist to either polymerize or become more soluble, depending on type of resist. The photoresist is then developed with a developer to remove selected portions of the photoresist thereby selectively exposing portions of the anti-reflective coating underneath the portions of the photoresist removed by the developer. Subsequently, the exposed anti-reflective coating is subjected to a dosage of ultraviolet radiation sufficient to remove at least a portion of the exposed anti-reflective coating. A pattern of circuitry is then provided.

Still other objects and advantages of the present invention will become readily apparent to those skilled in the art from the following description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects without departing from the invention. Accordingly, the drawings and description are to be regarded as illustrative in nature and not as restrictive.

BRIEF DESCRIPTION OF THE DRAWINGS

FIG. 4 represents a spectrum of radiation produced by a radiation source which may be used with processes of the present invention.

DETAILED DESCRIPTION OF PREFERRED EMBODIMENTS OF THE INVENTION

Figure 1:
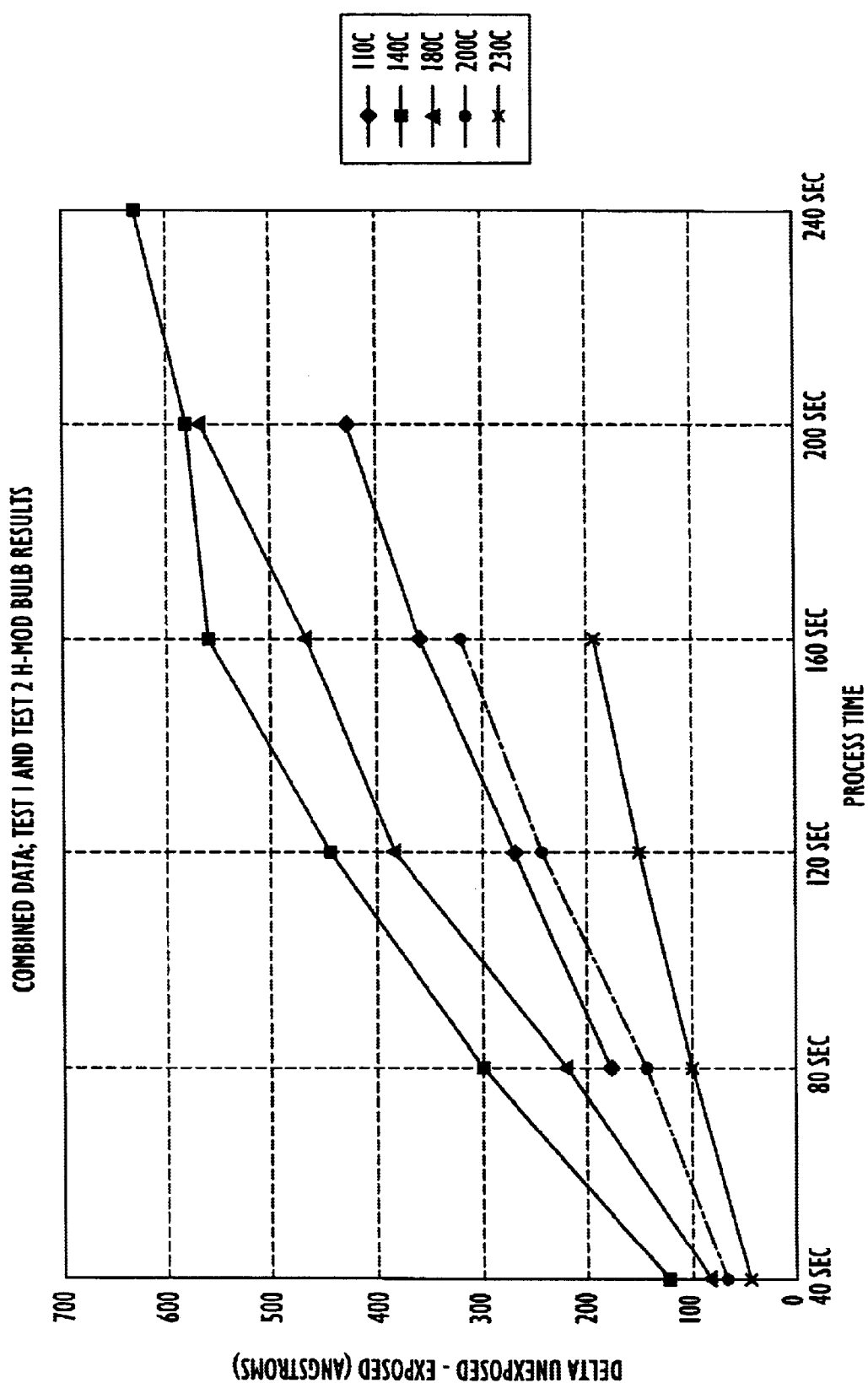
FIG. 1 represents a graph illustrating the reduction of anti-reflective coating thickness as function of temperature and time with substantially constant spectrum of UV radiation.

The present invention was developed to address problems existing in the art in processing substrates coated with anti-reflective coatings. The present invention at least partially removes portions of an anti-reflective coating on a substrate. Processes of the present invention also causes an anti-reflective coating to etch more quickly off of the surface of a substrate that it is deposited on. If the present invention is used to form an electronic device, the present invention also provides other advantages.

As a consequence of the changed characteristics of anti-reflective coatings resulting from processes of the present invention, the present invention provides a number of advantages. In particular, the present invention permits the elimination of costly equipment used especially to etch anti-reflective coating. Money may be saved by eliminating this equipment. Also, since the anti-reflective coating is more quickly removed, time and energy may be saved.

Additionally, in the past, because anti-reflective coatings have been difficult to remove, often, the etch process will continue longer than necessary to ensure that all of the coating will be removed. Without removing all of the anti-reflective coating, the subsequent etching of the substrate will be ineffective or at least partially faulty. Extended treatment of the anti-reflective coating even further reduces the thickness of photoresist remaining on the substrate, further increasing the likelihood of unintended exposure of the substrate resulting in device defects. Not only will the photoresist layer not be degraded significantly with the present invention, but the critical dimensions of the structures will not be adversely effected either.

The anti-reflective coating may be removed using existing equipment. Further, photoresist thicknesses will not be reduced or will be reduced to a much less degree than without treating underlying anti-reflective coatings according to the present invention. Other advantages of the processes of the present invention will also become apparent from the discussion below.

Processes of the present invention may be used to treat a wide variety of anti-reflective coatings deposited on substrates formed from a wide variety of materials. Examples of anti-reflective coatings which may be employed with the present invention include any organic anti-reflective coating. Among the anti-reflective coatings which may be used are any light-absorbing polymers. The invention is particularly effective with light-absorbing organic polymers designed for deep UV or i-line photolithography.

Organic anti-reflective coating materials which the present invention may be employed include aromatic polysulfone and polyurea polymers. However, the invention may be used with any anti-reflective coatings or light-absorbing polymers which are known to those skilled in the art. Examples of such materials may be found in U.S. Pat. No. 5,324,990 to Flaim et al., the entire disclosure of which is hereby incorporated by reference.

Other anti-reflective coatings which the present invention may be used with are dyed polymer anti-reflective coatings or dye-loaded anti-reflective coatings. The dyes absorb the radiation as it is directed at the anti-reflective coating. Such anti-reflective coatings may be applied by spin coating the dye and the polymer. Any other anti-reflective coating may also be used with the present invention.

The present invention is also directed to a method of forming an electronic device. The method includes treating an anti-reflective coating. In such methods, processes of the present invention may be used to treat a wide variety of anti-reflective coatings used in forming electronic devices that also include a wide variety of photoresist materials. Examples of photoresist materials which may be employed in processes according to the present invention include positive and negative photoresists. Although the present invention is effective when used with any type of photoresist which is applied to a substrate on top of an anti-reflective coating, the invention is particularly effective when used with positive photoresist. Examples of positive photoresist which may be employed with the present invention include polyhydroxystyrenes. Among the polyhydroxystyrenes which may be employed with the present invention are the particular ones developed by IBM Corporation and marketed under the brand name APEX. Any of the series of APEX photresists, including the APEX-E photoresist in particular (positive deep UV resist using tert-butoxycarbonate protected polydroxystyrene chemistry), may be used with methods of the present invention.

Although the present invention is particularly effective when used with an aromatic polysulfone anti-reflective coating in combination with APEX series photoresists, any photoresist, whether negative or positive, if used with an anti-reflective coating may be employed with the present invention. Further, according to the present invention, any anti-reflective coating and preferably an organic anti-reflective coating may be applied to the substrate prior to applying the photoresist. Regardless of the anti-reflective coating, substrate, photoresist, or other materials used, the above-described advantages of the present invention may result.

According to a method of the present invention, an anti-reflective coating on a substrate may be treated by exposing the anti-reflective coating to a dosage of ultraviolet (UV) radiation. The wavelength of the radiation may vary as long as the radiation results in the removal of at least a portion of the anti-reflective coating. Preferably, the UT radiation which the anti-reflective coating is subjected to comes from the mid to deep UV range. Typical wavelengths which preferably may be used are about 320 nm or less. Alternatively, typical wavelengths preferably employed with the invention may be at least about 200 nm and not bounded by the upper limit of 320 nm. More preferably, typical wavelengths may be between about 245 nm and about 320 nm. Further preferably, the wavelengths may be between about 245 nm and about 260 nm.

Other wavelengths of radiation may also be used to treat anti-reflective coatings according to the present invention. One skilled in the art, once aware of this disclosure could determine which wavelengths, exposure times, and other parameters are necessary to result in the desired amount of removal of the anti-reflective coating.

Preferably, the energy imparted to the anti-reflective coating by the portion of the dosage of radiation in the UV range, in the wavelength and exposure times discussed above, is at least about 10 mjoule/cm$^2$. More preferably the energy imparted by UV radiation may be 50 mjoule/cm$^2$ or higher. The radiation source may also put out other wavelengths of radiation in other portions of the spectrum. If this additional radiation is considered, the energy output may actually be greater than indicated above. However, any energy level, regardless of wavelength, exposure time, and any other parameter, which produces the desired amount of removal of the anti-reflective coating may be used according to methods of the present invention. Such energy amounts would be easily determined by those skilled in the art without undue experimentation.

The UV radiation may be generated using any known source. Among the sources which may be used are lasers and lamps producing the required UV wavelengths. For example, a deep UV lamp may be used as a radiation source. However, the present invention can be carried out with any deep UV output source.

A particularly suitable lamp is a microwave powered electrodeless lamp. Any particular embodiment and arrangement of such lamps which may be employed according to the method of the present invention. Such an electrodeless microwave-powered lamp is fully described in U.S. patent application Ser. No. 865,488 to Lynch et al., filed May 21, 1986, now U.S. Pat. No. 4,749,915, entitled "Microwave Powered Electrodeless Light Source"; U.S. patent application Ser. No. 177,434 to Lynch et al., filed Apr. 4, 1988, now U.S. Pat. No. 4,954,755, entitled "Electrodeless Lamp Having Hybrid Cavity"; U.S. patent application Ser. No. 686,042 to Lynch et al., filed Dec. 30, 1986, now U.S. Pat. No. 4,633,140, entitled "Electrodeless Lamp Having Staggered Turn-On Of Microwave Sources"; and U.S. patent application Ser. No. 393,856 to Ury, et al., filed Jun. 30, 1982, now U.S. Pat. No. 4,504,768, entitled "Electrodeless Lamp Using A Single Magnetron And Improved Lamp Envelop Therefore," the entire disclosures of all of which are hereby incorporated by reference, therefore, a more detailed discussion of which is not deemed necessary. Other radiation sources include the those marketed by Fusions Systems under the names H-BULB, H-MOD, and D-MOD. A spectrum of an embodiment of an H-MOD bulb is shown in FIG. 4. Although this H-MOD is spherical, any shape bulb may be used. Additionally, as understood, any radiation source capable of providing the required irradiation can be used.

The radiation sources may be used in any suitable device. One example of a device in which anti-reflective coatings may be treated according to the present invention is a Fusion 200 PCU photostabilizer, marketed by Fusion Systems, Inc.

Any particular embodiment and arrangement of radiation sources may be employed according to methods of the present invention for either treating the anti-reflective coating and/or the photoresist. One particular arrangement of microwave-powered electrodeless lamps which may be used with the invention is fully described in U.S. patent application Ser. No. 497,466 to Matthews, filed May 3, 1983, now U.S. Pat. No. 4,548,688, entitled "Hardening Of Photoresist," the entire disclosure of which is also hereby incorporated by reference.

The duration of the exposure of the anti-reflective coating to the dosage of ultraviolet light may vary, depending upon a variety of factors, including, among others, UV wavelength employed, the energy contained in the radiation, the specific chemistry of the ARC being treated, and the amount of anti-reflective coating which is desired to be removed. According to preferred embodiments, the exposure time may be at least 10 seconds. According to other preferred embodiments, the exposure time is less than about 160 seconds. According to further preferred embodiments, the exposure time is between about 40 seconds and about 160 seconds. However, any exposure time may be used. Certain exposure times may produce desired results with specific UV wavelengths; removal may also depend upon the specific anti-reflective coating used.

According to methods of the present invention for treating anti-reflective coatings may also include the step of subjecting the anti-reflective coating to elevated temperatures while exposing the anti-reflective coating to UV radiation. The removal of anti-reflective coating from substrates may be enhanced by the elevated temperature. According to methods of the invention, the anti-reflective coating may be subjected to temperatures of at least about 90° C. According to other preferred embodiments, the anti-reflective coating may be exposed to temperatures of at least 180° C. Still further preferred embodiments include exposing the anti-reflective coating to temperatures of at least about 200° C. Additional preferred embodiments include exposing the anti-reflective coating to temperatures of at least about 230° C.

Figure 2:
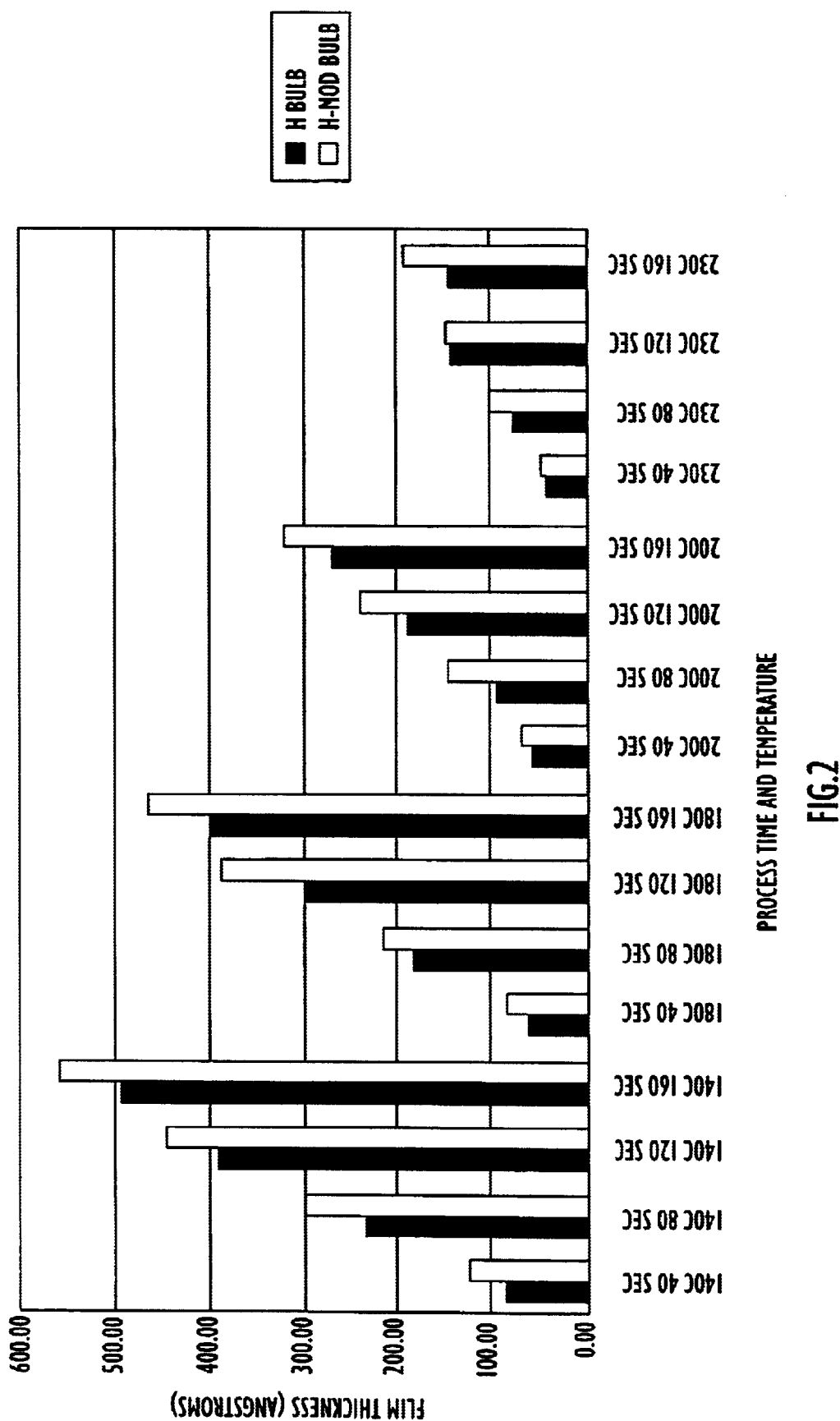
FIG. 2 represents a graph illustrating the reduction in thickness of the anti-reflective coating for given times and temperatures with substantially constant dosages of UV radiation from two different UV sources.

As shown in FIGS. 1 and 2, certain temperature and time combinations may be employed to obtain desired results. The results shown in FIGS. 1 and 2 were obtained using a constant UV irradiance and one particular anti-reflective coating. Therefore, the results may not be the same for other coatings, other wavelengths, other thickness of coatings, and other variables. However, once aware of the present invention, those skilled in the art can easily determine what particular combination of wavelengths, temperatures, exposure times, and other variables which produce the results they desire to obtain.

The present invention also includes methods of forming an electronic device. According to methods of the invention, a substrate is provided. The substrate may be formed from any suitable substance. For example, the substrate may be formed of a semiconductor substance. A particular example of a semiconductor which may be used is silicon. One form of silicon which may be used is a sheet of a single crystal of silicon.

A layer of an anti-reflective material may be deposited on the substrate. Substances which may be applied to the substrate as an anti-reflective coating are described above. The layer of anti-reflective coating may be applied in any known manner. For example, spin coating may be used to apply the anti-reflective coating. The layer of anti-reflective coating preferably is sufficient to completely cover all of the substrate which will be exposed to UV radiation in forming the desired pattern in the resist and to provide the desired degree of anti-reflectivity to the wavelength(s) of radiation used to treat the photoresist laid down on top of the ARC as described below. In typical embodiments, the anti-reflective coating may be from about 500 Å up to about 2,000 Å thick. More typically, the ARC may be from 500 Å to 1,000 Å thick. The anti-reflective coating may also be greater than 2,000 Å or less than 500 Å.

After being deposited, the layer of anti-reflective coating may be subjected to elevated temperatures to cure it.

After depositing the anti-reflective coating, a layer of photoresist may be deposited on top of the layer of anti-reflective coating. Photoresist materials that may be employed according to the invention include those specified above. Additionally, a wide variety of other photoresist materials can be employed in the process of the present invention. The photoresist materials include positive photoresists which are cross-linkable when exposed to UV radiation of up to 320 nm, particularly, any suitable deep UV photoresist may be used, including all chemically amplified photoresist. Also, those photoresists sensitized with diazo compounds may be employed.

Other photoresist materials that may be employed include the phenolic-formaldehyde type novolak polymers sensitized with a diazo compound. The phenols include phenol and substituted phenols such as cresol. Such are positive resist compositions and include therein a diazoketone, such as 2-diazo-1-naphthol-5-sulphonic acid ester. In such a composition, the ortho-diazoketone during the photochemical reaction is converted to a carboxylic acid. Other commercially available photoresists are suitable for carrying out the process of the present invention, including other novolak types.

Other photoresists which are currently commonly employed in applications with which the present invention may be useful include OIR-32, OIR-32MD, and OIR-897I marketed by OCG Microelectronic Materials; PFR IX061, PFR IX065, PFR IX500 EL, and PFR IX700 marketed by UCB-SR Electronics; THMR-iP3100, THMR iP3200, and ISCR-85i marketed by Tokyo Ohka Kogyo; FH-3950 marketed by Full Hunt; SPR 500-A and SPRT 500-A marketed by Shipely; and AZ 7500 and AZ 7500-T marketed by Hoechst Celanese AZ Photoresist. Further, photoresists may be employed with the present invention which may include any one or more of the following monomers and/or polymers MAA (methacrylic acid), MEPHS (3-methyl-4-hydroxystyrene), MMA (methyl methacrylate), NMP (N-methyl pyrolidone), PHS (poly(4-hydroxystyrene), PTBMA (poly(t-butyl methacrylate), TBMA (poly(t-butyl methacrylate), TBOC (tert-butyl-oxy-cardonyloxystyrene), Terpolymer (polymer comprised of 3 different monomer units), TMAH (tetramethyl ammonium hydroxide), and TPSTF (triphenyl sulfonium triflate). Further examples of photoresists which may be employed according to the present invention may be found in Pieter Burggraaf, *I-line Resist Progress: Expensive Science*, SEMICONDUCTOR INTERNATIONAL, August 1993, pp. 52–59; Robert D. Allen et al., *New single-layer positive resists for 193- and 248-nm lithography using methacrylate polymers*, SOLID STATE TECHNOLOGY, November 1993, pp. 53–62; Pieter Burggraaf, *What's Available in Deep-UV Resists?*, SEMI-CONDUCTOR INTERNATIONAL, September 1994, pp. 56–60; Diana D. Dunn et al., *DUV photolithography manufacturing*, SOLID STATE TECHNOLOGY, September 1994, pp. 53–58; the entire disclosures of all of which are hereby incorporated by reference.

The photoresist may be applied according to methods known to those skilled in the art. The thickness of the photoresist layer may vary, depending upon the application. Typically, the photoresist layer may be from about 7,000 Å to about 20,000 Å thick. However, the thickness is not limited to this range.

After the photoresist is applied to the substrate over top of the anti-reflective coating, the photoresist is selectively exposed to a radiation source. The radiation may be of any wavelength, whether in range of visible light or not. Preferably, the radiation is in the ultraviolet range. In order that the desired pattern may be formed in the photoresist, the radiation preferably is of a wavelength sufficient to cause an alteration of the exposed portions of the photoresist so as to change the solubility characteristics relative to the unexposed portions. During exposure, the radiation may cause the polymerization of the exposed portions of the photoresist.

The pattern in the photoresist typically is formed by placing a mask over the photoresist. The mask is opaque to the wavelengths of radiation used. Such masks are commonly known to those skilled in the art. Other means for selectively exposing the photoresist to radiation may also be used.

Next, the photoresist may be developed. In developing the photoresist, as stated above, depending upon whether positive or negative photoresist is used, either exposed or the unexposed portion of the photoresist will be removed. Any known process may be used to remove the photoresist. For example, a compound may be used in developing the photoresist which results in removing the desired portion of the photoresist. Typically, the compound used is a liquid used either at full strength, or diluted with an organic or inorganic solvent. Alternatively, the developer may be a solid dissolved in a solvent.

As the selected portion of the photoresist is removed the underlying anti-reflective coating may be exposed. Before proceeding with any further processing of the substrate, the exposed portions of the anti-reflective coating must be removed to allow the substrate to be directly processed. In removing the anti-reflective coating, it is undesirable to remove the photoresist. As discussed above, due to the characteristics of the ARC and the photoresist, the photoresist may be removed during the removal of the anti-reflective coating.

In order to at least partially remove the exposed anti-reflective coating, the present invention includes the step of exposing the exposed anti-reflective coating to a dosage of ultraviolet radiation. Exposure of the anti-reflective coating to ultraviolet radiation has a number of unexpected advantages. Among the advantages are that the anti-reflective coating is at least partially removed by the dosage of UV radiation. Exposing the anti-reflective coating to ultraviolet radiation also causes the anti-reflective coating to etch more quickly off of the surface of a substrate that it is deposited on. By changing the selectivity of anti-reflective coatings, the anti-reflective coatings are more susceptible to etching processes used to remove the coatings from a substrate than photoresist material applied on top of the anti-reflective coating. Exposure of the ARC to UV radiation may also change the ARC etch rate, and may alleviate any of the problems discussed in this application relative to the ARC alone and/or in relation to the photoresist.

Similar process parameters for wavelength of ultraviolet radiation used and time of exposure discussed above for treating an anti-reflective coating on a substrate may be applied when forming an electronic device according to the present invention.

Preferably, the present invention substantially completely removes the anti-reflective coating and if covered by a photoresist, substantially completely removes all of the exposed portions of the photoresist. However, in the event that all of the anti-reflective coating is not removed, after treating the exposed anti-reflective coating, any remaining exposed ARC material may be removed from the surface of the substrate. The remaining ARC may be removed by etching, treatment with a solution, or any other treatment suitable for removing the anti-reflective coating involved, including those treatments commonly known to those skilled in the art. The substrate may be processed and a pattern of circuitry formed on the substrate according to any method known to those skilled in the art.

Prior to further processing the substrate, the anti-reflective coating may be also exposed to elevated temperatures. The elevated temperatures may be applied to the anti-reflective coating, substrate, and photoresist at the same time or before or after exposure of the anti-reflective coating to the ultraviolet radiation. The parameters for the process of exposing the anti-reflective coating to elevated temperatures are similar to those discussed above for exposing an anti-reflective coating applied to a substrate. Exposing the anti-reflective coating to elevated temperatures may change the selectivity of the anti-reflective coating relative to the photoresist, change the ARC etch rate, and alleviate any of the other problems described above regarding the ARC and/or ARC relative to the photoresist.

The exposed and developed photoresist may also be treated by exposing it to ultraviolet radiation alone or along with, preceded by, or followed by exposure to elevated temperatures. One example of a treatment for hardening the photoresist is described in previously cited U.S. Pat. No. 4,548,688 to Matthews. The parameters of the process described in Matthews may also be applied to treating the anti-reflective coating described above. Preferably, the temperature to which the photoresist and/or the anti-reflective coating is subjected is below a flow temperature of the photoresist, regardless of the state of hardening of the photoresist. The flow temperature may be defined as the temperature which causes the photoresist to deform when exposed to the temperature.

The photoresist may be treated prior to or subsequent to the processing of the anti-reflective coating. Further, the treatment of the anti-reflective coating and the photoresist may be carried out simultaneously. In any event, treatment of the photoresist should be carried out prior to any further processing of the substrate.

After treatment of the anti-reflective coating and/or the photoresist, circuitry may be provided in and/or on the substrate.

FIGS. 1 and 2 show the effectiveness of processes of the present invention, which include the treatment of an anti-reflective coating with UV radiation. FIG. 1 represents the results of subjecting an anti-reflective coating to both UV radiation and elevated temperature. A similar UV spectrum and power of UV radiation were used in each of the trials represented by the data points reported in FIG. 1. As can be seen in FIG. 1, the time and temperature were, however, varied. The results reported in FIG. 1 indicate that the effectiveness of a process, which involves treating an anti-reflective coating with UV radiation and elevated temperatures, according to the present invention, increases in effectiveness as exposure time and temperature increase for a constant UV dosage.

FIG. 2 shows the results of a series of trials conducted with various exposure times and temperatures as well as two different UV spectra. Although the dosage of UV radiation remaining substantially the same, two different sources were used, with the effect on the results shown in FIG. 2. The results shown in FIG. 2 indicate that both exposure time and dosage of radiation may be varied to optimize the amount of anti-reflective coating removed from the underlying substrate.

Figure 3:
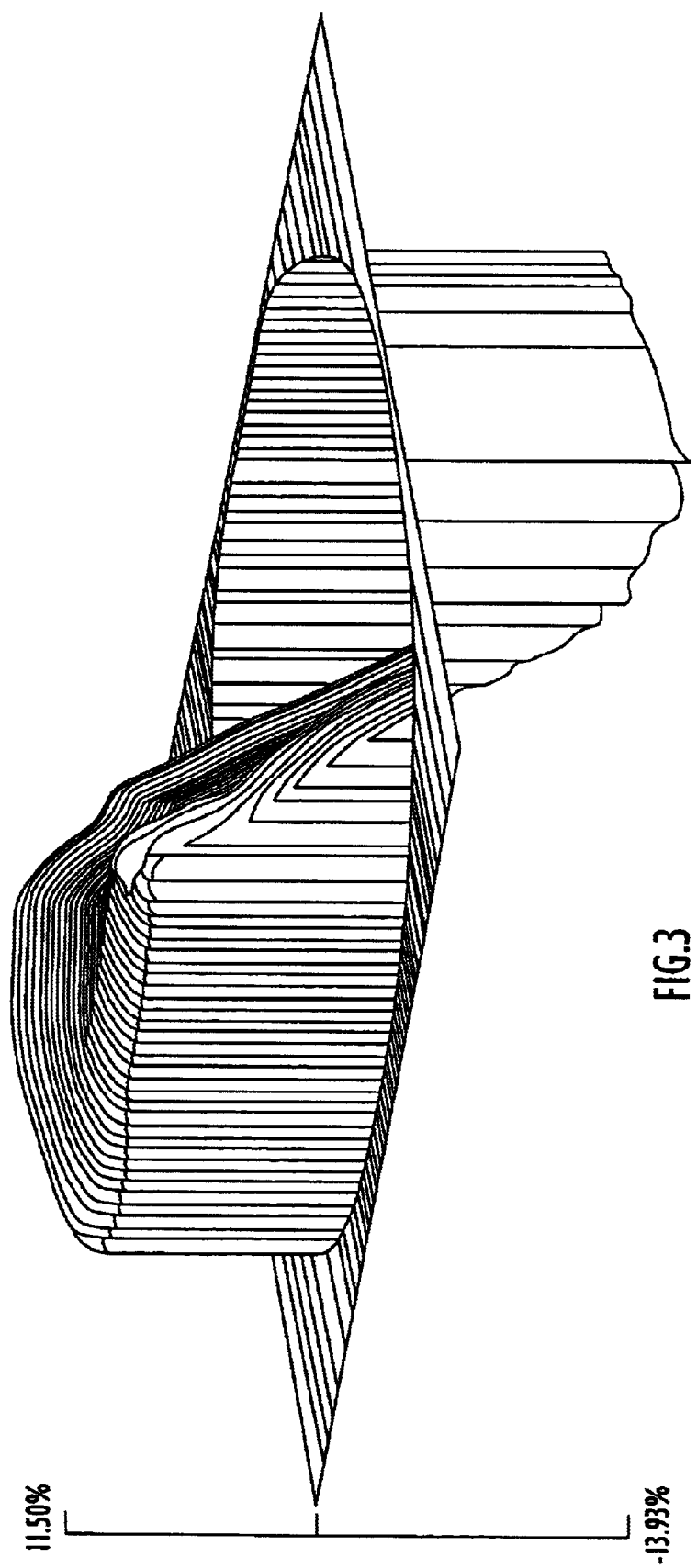
FIG. 3 represents a graph illustrating the relative thickness of anti-reflective coating treated with UV compared to the thickness of anti-reflective coating that has not been treated.

FIG. 3 represents a graph illustrating the relative thickness of anti-reflective coating treated with UV compared to the thickness of anti-reflective coating that has not been treated. The plane shown in FIG. 3 represents the average thickness of all portions of the anti-reflective coating on the substrate after treatment according to one embodiment of the present invention. The left portion of the graph represents the thickness of untreated portions of the ARC while the right portion represents the thickness of treated portions of the ARC.

The processes which were used to produce the results shown in FIGS. 1–3 were produced using a Fusion 200 PCU photostabilizer available from Fusion Systems, Inc. The radiation sources used in the processes were Fusion H-MOD bulbs also available from Fusion Systems, Inc. FIG. 4 shows the spectrum of radiation produced by one such bulb.

According to one example of the present invention, a process of treating an anti-reflective coating was performed using a Fusion 200 PCU photostabilizer device. The radiation source was an H-MOD bulb produced by Fusion Systems. The anti-reflective coating was exposed at a temperature of about 230° C. for about 120 seconds. The wafer diameter exposed was a silicon wafer about 100.00 mm or about 3.94 inches. The test diameter, that portion of the substrate which was measured to determine the results of the test, was about 88.00 mm or about 3.46 inches. The thickness of the anti-reflective coating after treatment was about 616.98 Å. The standard deviation was about 67.473. The minimum thickness of the anti-reflective coating after treatment was about 531.07 Å, with the maximum being about 687.92. Forty-nine sites on the substrate were measured over a test area of 88.00 mm on the substrate.

In this disclosure, there is shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. A method of treating an anti-reflective coating on a substrate, said method comprising:
    directly exposing an exposed anti-reflective coating to a dosage of ultraviolet radiation sufficient to result in the direct removal of at least a portion of the exposed anti-reflective coating.

2. A method according to claim 1, further comprising the step of:
    exposing the exposed anti-reflective coating to elevated temperature while exposing the exposed anti-reflective coating to the dosage of ultraviolet radiation.

3. A method of forming an electronic device, said method comprising the steps of:
    a) providing a substrate;
    b) depositing a layer of an anti-reflective coating on the substrate;
    c) depositing a layer of a photoresist material on the anti-reflective coating;
    d) exposing the layer of photoresist to ultraviolet radiation of a dosage sufficient to cause the photoresist to selectively become soluble in developer;
    e) developing the photoresist with a developer to remove portions of the photoresist thereby exposing the anti-reflective coating under portions of the photoresist removed by the developer;
    f) subjecting the exposed anti-reflective coating to ultraviolet radiation sufficient to directly remove at least a portion of the exposed anti-reflective coating while simultaneously crosslinking the photoresist; and
    g) selectively etching a pattern of circuitry on said substrate.

4. A method according to claim 3, further comprising the step of:
    subjecting the exposed anti-reflective coating and photoresist remaining on the substrate to an elevated temperature while subjecting the exposed anti-reflective coating and photoresist remaining on the substrate to ultraviolet radiation, said temperature being less than a flow temperature of the photoresist.

5. A method according to claim 4, further comprising the step of:
    increasing the temperature to which the photoresist layer is subjected as the crosslinking of the photoresist increases, wherein said temperature is always below a flow temperature of the photresist.

6. A method according to claim 5, wherein said photoresist is a positive photoresist.

7. A method according to claim 6, wherein said positive photoresist is a polyhydroxystyrene.

8. A method according to claim 7 wherein said positive photoresist is tertbutoxycarbonate protected.

9. A method according to claim 6, wherein said circuitry has critical dimensions of less than about 1.0 μm.

10. A method according to claim 6, wherein said circuitry has critical dimensions of less than about 0.5 μm.

11. A method according to claim 3, wherein said anti-reflective coating is an aromatic polysulfone.

12. A method according to claim 3, wherein said ultraviolet radiation to which said exposed anti-reflective coating is subjected has wavelengths of about 320 nm or less.

13. A method according to claim 3, wherein said ultraviolet radiation to which said exposed anti-reflective coating is subjected has wavelengths of at least about 180 nm.

14. A method according to claim 3, wherein said ultraviolet radiation to which said exposed anti-reflective coating is subjected has wavelengths of about 200 to about 320 nm.

15. A method according to claim 3, wherein ultraviolet radiation to which said exposed anti-reflective coating is subjected has wavelengths of about 240 to about 260 nm.

16. A method according to claim 4, wherein said elevated temperature to which said exposed anti-reflective coating is subjected is above about 100° C.

17. A method according to claim 4, wherein said elevated temperature to which said exposed anti-reflective coating is subjected is above about 120° C.

18. A method according to claim 4, wherein said elevated temperature to which said exposed anti-reflective coating is subjected is above about 200° C.

19. A method according to claim 3, wherein said photoresist is a diazo sensitized polymer composition.

20. A method according to claim 3, wherein said photoresist is a phenolic-formaldehyde novolak photoresist.

21. A method according to claim 3, wherein said photoresist is a chemically amplified polyhydroxystyrene.

22. A method according to claim 3, wherein said layer of photoresist is about 7,000 Å to about 20,000 Å thick.

23. A method according to claim 3, wherein said subjecting of said exposed anti-reflective coating to said ultraviolet light increases a susceptibility of the exposed anti-reflective coating to etch as compared to said photoresist, thereby reducing an amount of photoresist which is removed as said exposed anti-reflective coating is etched.

24. A method according to claim 3, further comprising the step of:
    removing any remaining exposed anti-reflective coating after subjecting said exposed anti-reflective coating to said ultraviolet radiation.

25. A method according to claim 3, wherein said exposed anti-reflective coating is subjected to said ultraviolet radiation for at least about 40 seconds.

26. A method according to claim 3, wherein said exposed anti-reflective coating is subjected to said ultraviolet radiation for less that about 160 seconds.

27. A method according to claim 3, wherein said exposed anti-reflective coating is subjected to said ultraviolet radiation for between about 40 seconds and about 160 seconds.

28. A method according to claim 3, wherein said anti-reflective coating is at least about 500 Å thick.

29. A method according to claim 3, wherein said anti-reflective coating is from about 500 Å to about 2000 Å thick.

30. A method according to claim 3, wherein said anti-reflective coating is from about 500 Å to about 1000 Å thick.

31. A method according to claim 6, wherein said circuitry has critical dimensions of less than about 0.35 μm.

32. A method according to claim 3, wherein said ultra-violet radiation imparts at least about 10 Joule/cm$^2$ to the anti-reflective coating.

33. A method according to claim 3, wherein said ultra-violet radiation imparts at least about 50 Joule/cm$^2$ to the anti-reflective coating.

* * * * *